United States Patent
Lu et al.

(10) Patent No.: US 7,476,568 B2
(45) Date of Patent: Jan. 13, 2009

(54) WAFER-LEVEL ASSEMBLY OF HEAT SPREADERS FOR DUAL IHS PACKAGES

(75) Inventors: Daoqiang Lu, Chandler, AZ (US); Rajashree Baskaran, Phoenix, AZ (US); Chuan Hu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 138 days.

(21) Appl. No.: 11/479,740

(22) Filed: Jun. 30, 2006

(65) Prior Publication Data

US 2008/0003719 A1 Jan. 3, 2008

(51) Int. Cl.
*H01L 21/44* (2006.01)
*H01L 21/48* (2006.01)
*H01L 21/50* (2006.01)

(52) U.S. Cl. .............. 438/113; 438/106; 257/E21.054; 257/E21.229; 257/E21.347; 257/E21.475; 257/E21.499

(58) Field of Classification Search ................ 438/113, 438/68, 118, 122, 107, 106, 687, 688, 455, 438/456, 465, 308, 745, 931
See application file for complete search history.

(56) References Cited

U.S. PATENT DOCUMENTS

| | | | |
|---|---|---|---|
| 6,314,639 B1 * | 11/2001 | Corisis | 29/827 |
| 6,505,400 B1 * | 1/2003 | Corisis | 29/832 |
| 6,735,859 B2 * | 5/2004 | Corsis | 29/854 |
| 7,166,540 B2 * | 1/2007 | Deshpande et al. | 438/759 |
| 7,288,438 B2 * | 10/2007 | Lu | 438/122 |
| 2007/0131737 A1 * | 6/2007 | Renavikar et al. | 228/231 |

OTHER PUBLICATIONS

So, William W., et al., "High Temperature Joints Manufactured at Low Temperature", IEEE, 1998, Electronics Components and Technology Conference, pp. 284-291.
Bock, K., et al., "New Manufacturing Concepts for Ultra-Thin Silicon and Gallium Arsenide Substrates", 2003, International Conf. on Compound Semiconductor Mfg.

* cited by examiner

*Primary Examiner*—David Nhu
(74) *Attorney, Agent, or Firm*—Blakely, Sokoloff, Taylor & Zafman LLP

(57) ABSTRACT

An embodiment of the present invention is a technique to fabricate a package. A heat spreader (HS) array on a HS support substrate is formed. The HS array has a plurality of heat spreaders. A diced wafer supported by a wafer support substrate (WSS) is formed. The diced wafer has a plurality of thin dice. The thin dice in the diced wafer are bonded to the heat spreaders in the HS array to form HS-bonded thin dice between the HS support substrate and the WSS.

8 Claims, 11 Drawing Sheets

WAFER-LEVEL ASSEMBLY OF HEAT SPREADERS FOR DUAL IHS PACKAGES

BACKGROUND

1. Field of the Invention

Embodiments of the invention relate to the field of semiconductor, and more specifically, to semiconductor packaging.

2. Description of the Related Art

Advances in packaging technologies for semiconductor devices have provided many opportunities for development of efficient thermal management. One thermal management scheme is the use of heat spreaders on semiconductor dice.

Existing techniques for attaching heat spreaders on ultra-thin dice have a number of disadvantages. One technique uses high accuracy pick-and-place equipment. This technique is time-consuming, leading to delay and high cost in the manufacturing cycle. In addition, when adhesive is used to form the heat spreader array, releasing the heat spreaders to ultra-thin die bonding is quite challenging.

BRIEF DESCRIPTION OF THE DRAWINGS

Embodiments of invention may best be understood by referring to the following description and accompanying drawings that are used to illustrate embodiments of the invention. In the drawings.

DESCRIPTION

Figure 1A:
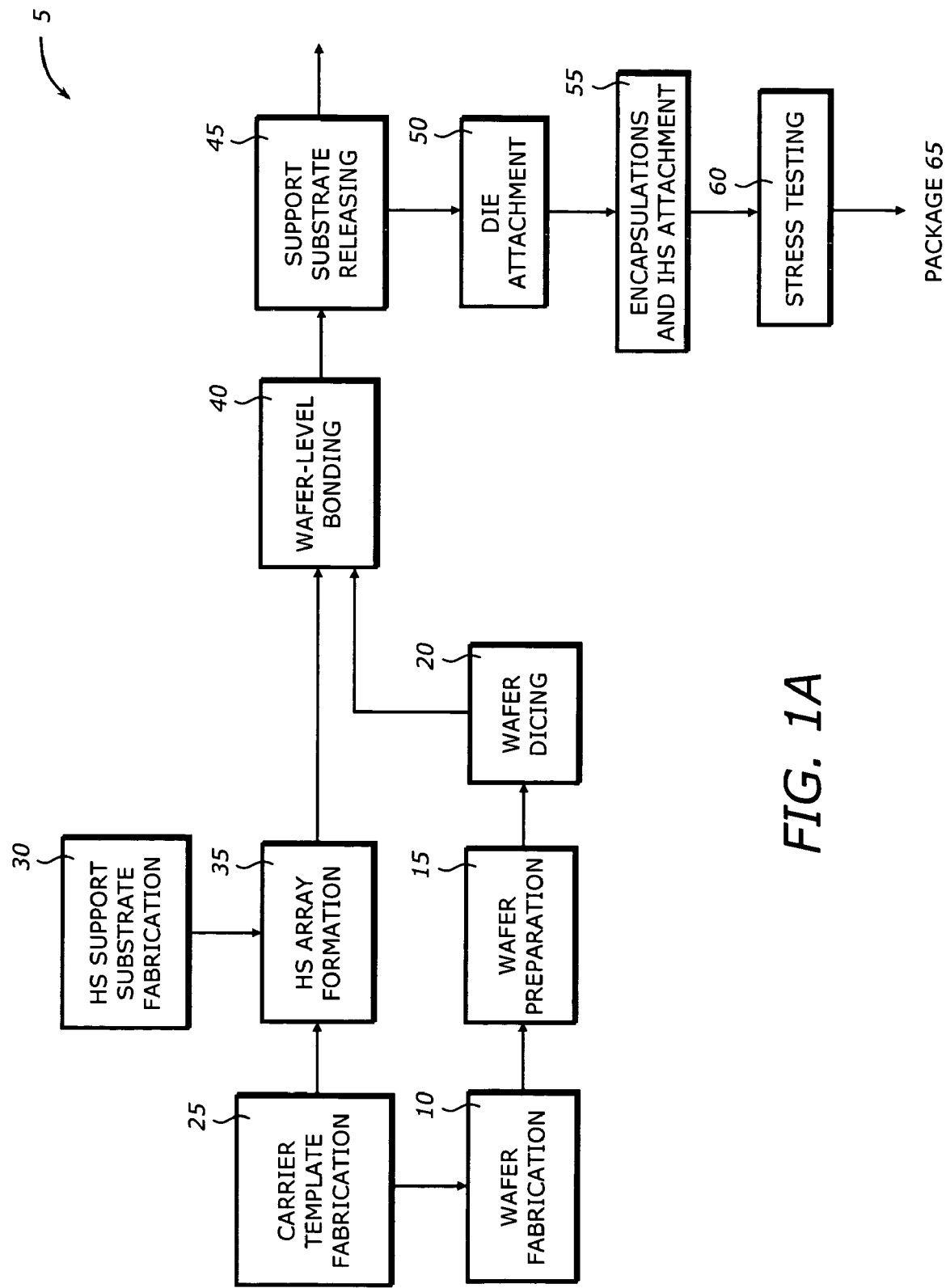
FIG. 1A is a diagram illustrating a manufacturing system in which one embodiment of the invention can be practiced.

An embodiment of the present invention is a technique to fabricate a package. A heat spreader (HS) array on a HS support substrate is formed. The HS array has a plurality of heat spreaders. A diced wafer supported by a wafer support substrate (WSS) is formed. The diced wafer has a plurality of thin dice. The thin dice in the diced wafer are bonded to the heat spreaders in the HS array to form HS-bonded thin dice between the HS support substrate and the WSS.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

An embodiment of the present invention is a technique to fabricate a package having two heat spreaders. The technique includes wafer-level bonding an array of heat spreaders to a diced thinned wafer. A carrier template having an array of cavities is fabricated with high precision. The dimensions and positions of the cavities are carefully matched with the dimensions and positions of the dice on the silicon wafer to which the heat spreaders are bonded. The heat spreaders (HS) which have a thin layer of a solder layer on one side are placed in the cavities of the carrier template (i.e., the side with the solder of the HS faces the carrier template). The thin solder layer acts as a first thermal interface material (TIM) when the dice are assembled into packages. A heat spreader support substrate covered by a thin layer of silicone such as polydimethyl siloxane (PDMS) is then placed on the heat spreaders under a pressure. Due to the van der Waals forces between the PDMS and the heat spreaders, all the heat spreaders in the carrier template adhere to the thin PDMS layer. The HS array is transferred to the PDMS-coated support substrate. A diced wafer is formed by mounting a wafer onto a wafer support substrate (WSS), thinning the wafer, depositing a backside metallurgy (BSM) layer and/or a thin solder layer on backside of the wafer, and dicing the thinned wafer into thin dice without releasing dies from the WSS. Then, the HS array is aligned and bonded to the thin dice on the diced wafer by reflowing the solder layer on the HS array and/or Si dice under pressure. The HS support substrate is then released from the HS array-bonded wafer. The HS array-bonded wafer is then mounted on a dicing tape and the WSS is released. The individual HS-bonded dice are then assembled into packages.

Each package has a second TIM and a second heat spreader with a larger size for further heat spreading.

The technique provides efficient placement of HS array because the carrier template may be manufactured in advance with high precision. Therefore, time-consuming high accuracy pick-and-place operation for HS array is eliminated. In addition, the technique eliminates the use of any adhesive for attaching the heat spreaders on the support substrate and associated support substrate releasing processing operations. Furthermore, the compliant PDMS layer on the HS support substrate may better compensate the non-co-planarity and HS thickness variations, leading to better bond-line control between the heat spreaders and the silicon dice.

FIG. 1A is a diagram illustrating a manufacturing system 5 in which one embodiment of the invention can be practiced. The system 5 includes a wafer fabrication phase 10, wafer preparation phase 15, a wafer dicing phase 20, a carrier template fabrication phase 25, a heat spreader (HS) support substrate fabrication phase 30, a HS array formation phase 35, a wafer-level bonding phase 40, a support substrate releasing phase 45, a die attachment phase 50, an encapsulation and HIS attachment phase 55, and a stress testing phase 60. The system 5 represents a manufacturing flow of a semiconductor packaging process.

The wafer fabrication phase 10 fabricates the wafer containing a number of dice. The individual dice may be any microelectronic devices such as microprocessors, memory devices, interface circuits, high power optical devices etc. The wafer fabrication phase 10 includes typical processes for semiconductor fabrication such as preparation of the wafer surface, growth of silicon dioxide ($SiO_2$), patterning and subsequent implantation or diffusion of dopants to obtain the desired electrical properties, growth or deposition of a gate dielectric, and growth or deposition of insulating materials, depositing layers of metal and insulating material and etching it into the desired patterns. Typically the metal layers consist of aluminium or copper. The various metal layers are interconnected by etching holes, called "vias," in the insulating material.

The wafer preparation phase 15 prepares a wafer containing dice for packaging and testing. During this phase, the wafers are sorted after the patterning process. An inspection may be carried out to check for wafer defects. Then, the wafer may be mounted on a wafer support substrate (WSS) that adheres to the front side (or bump side) of the wafer. The WSS provides mechanical support for handling during subsequent phases. The wafer is then thinned to a desired thickness to provide ultra-thin wafer. Additional processing may be performed to prepare the wafer for subsequent phases, such as deposition of backside metallization (BSM) or solder layer on the wafer.

The wafer dicing phase 20 dices, cuts, or saws the wafer into individual dice from the backside of the wafer. The dicing depth may be well controlled such that only the thin wafer is diced and the WSS may not be diced. High precision saw blade/laser and image recognition unit may be used. De-ionized water may be dispensed on the wafer to wash away any residual particles or contaminants during the dicing. Then, the wafer is dried by being spun at high spinning speed.

The carrier template fabrication phase 25 fabricates one or more carrier templates to carry the heat spreaders to be bonded with the dice on the wafer. The fabrication may be performed on facilities outside the semiconductor fabrication facilities such as by other vendors. The carrier template fabrication phase 25 receives information or data files regarding the dimensions and positions of the dice on the wafer. This information is used to fabricate the carrier templates with high precision.

The HS support substrate fabrication phase 30 fabricates the HS support substrate to support the array of heat spreaders. The HS support substrate may be used to hold the heat spreaders for precision bonding with the dice.

The HS array formation phase 35 forms the HS array supported by the HS support substrate. The heat spreaders may be fabricated by HS manufacturers and used in this phase. The HS array contains the heat spreaders that are positioned to correspond to the positions of the dice on the wafer.

The wafer-level bonding phase 40 bonds the HS array to the dice on the wafer. The bonding essentially attaches the heat spreaders to the corresponding dice at the wafer level.

The support substrate releasing phase 45 releases the HS support substrate and the wafer support substrate from the assembly. The resulting assembly includes array of dice attached to first heat spreaders.

The die attachment phase 50 attaches the die to a package substrate. The substrate material depends on the packaging type. It may be ceramic, organic, or inorganic such as silicon. The die may be attached to a package substrate through flip chip technology.

The encapsulation and IHS attachment phase 55 underfills the gap between the die and the substrate and attaches an IHS. Underfill material may be dispensed between the die and the substrate. Integrated heat spreader (IHS) may be attached to the die and substrate assembly. The fully assembled package 65 is ready to be tested.

The stress testing phase 60 performs one or more tests such as Highly Accelerated Stress Test (HAST) or biased-HAST on the device package under stress conditions. A test chamber may be designed to conduct a stress test. It may have monitoring circuits, measurement circuits, and other data processing equipment. The package 65 is placed in the test chamber subject to the stress test. It may be powered or non-powered. Various stress tests may be performed on the wafer or on the packaged devices 65 at various points of the manufacturing process flow. The tests may follow standards such as Joint Electron Device Engineering Council (JEDEC) standards or military standards. Examples of these tests may include electrostatic discharge (ESD), or human body model (HBM), high temperature operational life (HTOL), thermal shock, temperature cycle, high temperature storage, vibration and mechanical loading, shear testing, and accelerated moisture resistance.

Figure 1B:
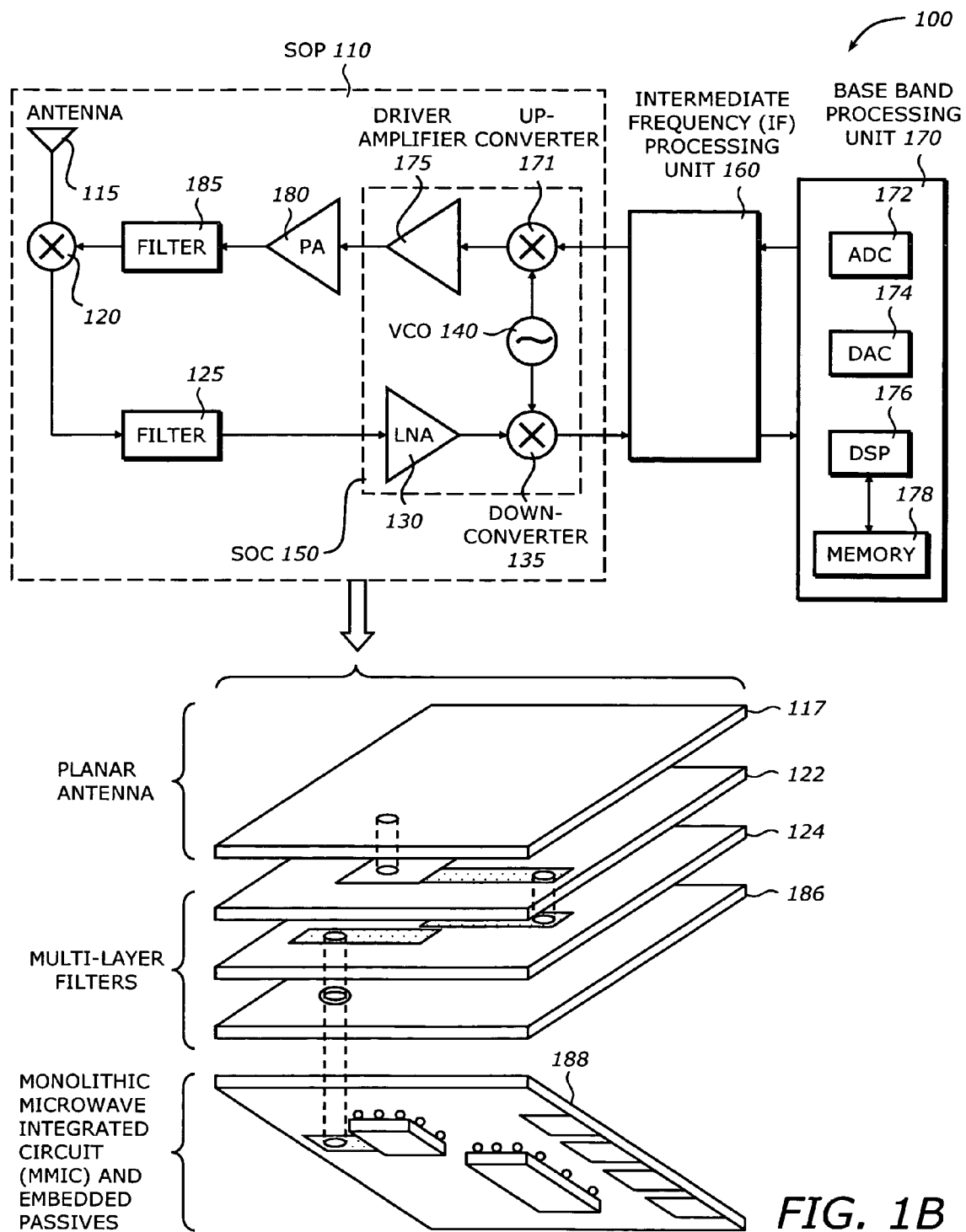
FIG. 1B is a diagram illustrating a system according to one embodiment of the invention.

FIG. 1B is a diagram illustrating a system 100 according to one embodiment of the invention. The system 100 represents a mobile communication module. It includes a system on package (SOP) 110, an intermediate frequency processing unit 160, and a base-band processing unit 170.

The SOP 110 represents the front end processing unit for the mobile communication module. It is a transceiver incorporating on-package integrated lumped passive components as well as radio frequency (RF) components. It includes an antenna 115, a duplexer 120, a filter 125, a system-on-chip (SOC) 150, a power amplifier (PA) 180, and a filter 185.

The antenna 115 receives and transmits RF signals. The RF signals may be converted to digital data for processing in subsequent stages. It is designed in compact micro-strip and strip-line for L and C-band wireless applications. The duplexer 120 acts as a switch to couple to the antenna 115 to the receiver and the transmitter to the antenna 115. The filters 125 and 185 are C-band LTCC-strip-line filter or multilayer organic lumped-element filter at 5.2 GHz and narrowband performance of 200 MHz suitable for the Institute of Electrical and Electronic Engineers (IEEE) 802.11 wireless local area network (WLAN). The SOC 150 includes a low noise amplifier (LNA) 130, a down converter 135, a local voltage controlled oscillator (VCO) 140, an up converter 171, and a driver amplifier 175. The LNA 130 amplifies the received signal. The down converter 135 is a mixer to convert the RF signal to the IF band to be processed by the IF processing unit 160. The up converter 171 is a mixer to convert the IF signal to the proper RF signal for transmission. The VCO 140 generates modulation signal at appropriate frequencies for down conversion and up conversion. The driver amplifier 175 drives the PA 180. The PA 180 amplifies the transmit signal for transmission.

The IF processing unit 160 includes analog components to process IF signals for receiving and transmission. It may include a band-pass filter and a low pass filter at suitable frequency bands. The filter may provide base-band signal to the base-band processing unit 170. The base-band processing unit 170 may include an analog-to-digital converter (ADC) 172, a digital-to-analog converter (DAC) 174, a digital signal processor (DSP) 176, and memory device 178. The ADC 172 and the DAC 174 are used to convert analog signals to digital data and digital data to analog signal, respectively. The DSP 176 is a programmable processor that may execute a program to process the digital data. The memory device 178 may be flash memories or random access memories. It may be packaged using Flip-Chip Ball Grid Array (FCBGA) packaging technology, a molded packaging, or any other suitable packaging technologies. The memory device 178 may be manufactured according to the manufacturing flow 5 shown in FIG. 1A. It may be the device package 65. It may include an ultra-thin die in the package. The base-band processing unit 170 may also include memory and peripheral components. The DSP 176 may, therefore, be coupled to the front end processing unit via the IF processing unit 160 and/or the base-band processing unit 170 to process the digital data.

The SOP 110 may be a multi-layer three-dimensional (3D) architecture for a monolithic microwave integrated circuit (MMIC) with embedded passives (EP) technology. It may be implemented using Low Temperature Co-fired Ceramics (LTCC) and organic-based technologies. The 3D architecture may include multiple layers include a layer 117 to implement the antenna 115, layers 122, 124, and 186 for the filters 125 and 185, and layer 188 for the SOC 150 and the passive components using EP technology. Typically, the packaging technology involves embedded passives with multiple layers.

Figure 2A:
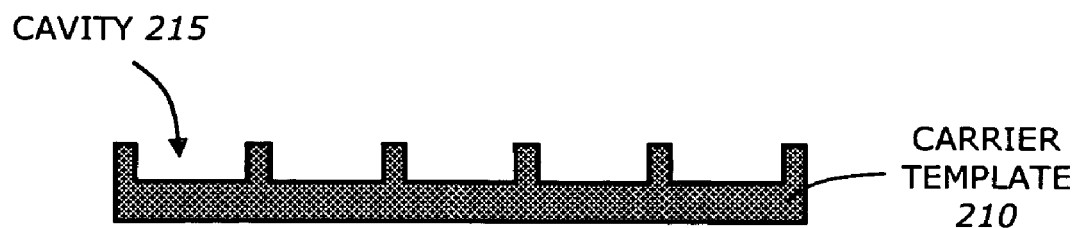
FIG. 2A is a diagram illustrating a carrier template according to one embodiment of the invention.

FIG. 2A is a diagram illustrating a carrier template 210 according to one embodiment of the invention. The carrier template 210 may be manufactured in advance and separately from the packaging process. The carrier template 210 may be made from materials such as silicon. It has a number of cavities 215 with tight dimensional tolerances. The cavities 215 may be formed or fabricated using wet etching or any other etching processes.

The dimensions and positions of the cavities 215 are carefully matched with the dimensions and positions of the heat spreaders that are bonded to the corresponding dice on a wafer. The dimensions and positions of the dice on the wafer are typically known in advance and may be available in computer readable forms which may be used to precisely control the formation of the cavities 215. The fabrication of the carrier template 210 and the cavities 215 may be performed independently and separately from the packaging process.

Figure 2B:
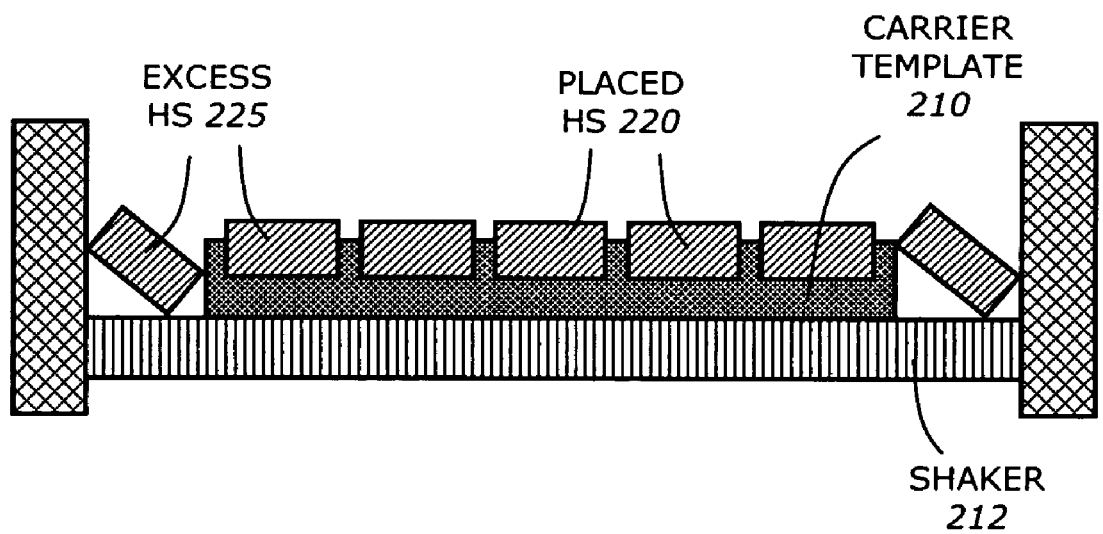
FIG. 2B is a diagram illustrating placing heat spreaders into cavities of the carrier template according to one embodiment of the invention.

FIG. 2B is a diagram illustrating placing heat spreaders into cavities of the carrier template according to one embodiment of the invention.

The carrier template 210 is placed in a shaker 212. The shaker 212 may be a mechanical shaker that shakes or vibrates at a predetermined rate. It typically has enclosure to keep items or articles being shaken from being thrown out during shaking. A number of heat spreaders are placed inside the shaker 212 on the carrier template 210. The heat spreaders (HS) are designed to have dimensions fit within the cavities 215, which in turn fit the dimensions of the dice on the wafer. They may be made by any material having a high thermal conductivity such as copper or SiC. Through gravity and shaking forces, the heat spreaders self assemble and fall into the cavities 215 to become HS 220. Heat spreaders that do not fall into the cavities 215 are excess HS 225 and may be removed from the shaker 212. There are many other methods of achieving the same impact as 'shaking' using other agitating methods such as acoustic agitation or electrostatic agitation that results in the HSs self assembling in the required cavities.

Alternatively, the heat spreaders may be placed into the cavities 215 by a pick-and-place equipment. Since the carrier template 210 is made of rigid material and is not a fragile object, the pick-and-place equipment may place the heat spreaders in the cavities 215 without high precision or accuracy. Through gravity, the heat spreaders may settle into the cavities 215 when they are slightly misplaced.

Figure 2C:
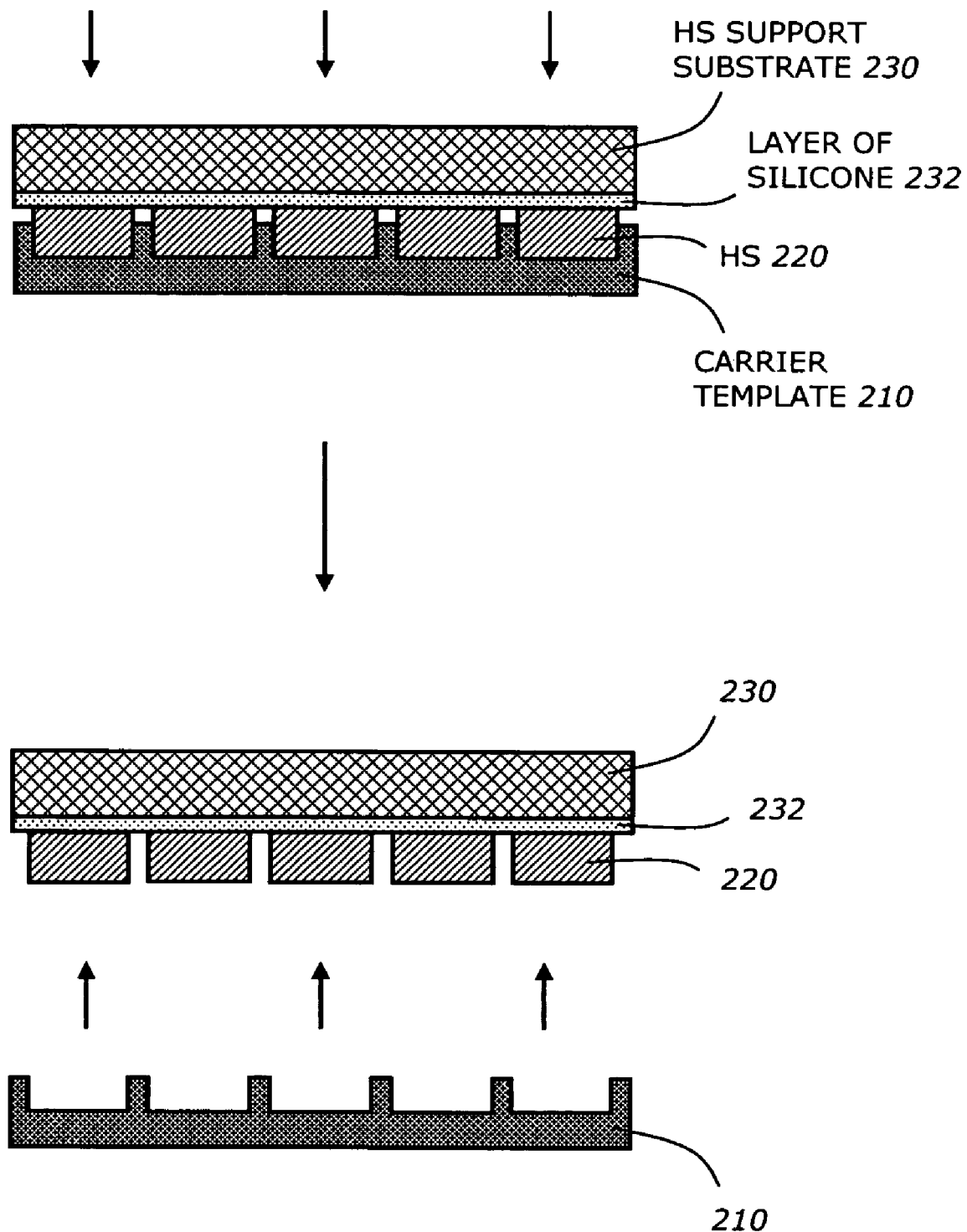
FIG. 2C is a diagram illustrating forming a heat spreader (HS) array on a HS support substrate according to one embodiment of the invention.

FIG. 2C is a diagram illustrating forming a heat spreader (HS) array on a HS support substrate according to one embodiment of the invention. The heat spreaders 220 in the cavities 215 are now transferred to a HS support substrate 230. The HS support substrate 230 may be any suitable material, such as glass. It is coated or covered by a thin layer of silicone 232. The silicone 232 may be any polymer that has good adhesive property. One such polymer is the poly-dimethyl siloxane (PDMS), a rubber material.

The HS support substrate 230 with the PDMS layer 232 is placed, or pressed, on the HS 220 in the cavities 215 of the carrier template 210. The PDMS layer 232 picks up all the HS 220 due to the van der Waals force. The HS 220 stay at the same positions on the HS support substrate 230 as they are in the cavities 215. Therefore, the HS 220 form an array of heat spreaders that are located at positions to correspond or match with positions of dice on a wafer. The carrier template 210 may be discarded or re-used to hold a next array of heat spreaders. The HS support substrate 230, the layer of silicone 232 and the HS array 220 form the HS array 235 with HS support substrate.

Figure 2D:
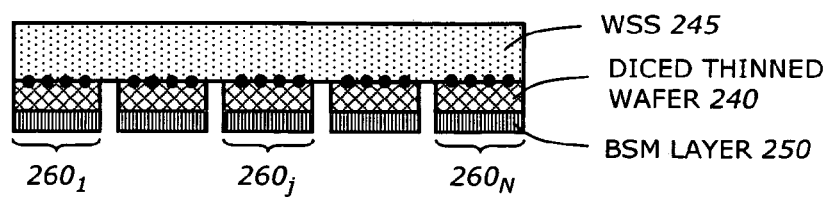
FIG. 2D is a diagram illustrating a diced wafer supported by a wafer support substrate (WSS) according to one embodiment of the invention.

FIG. 2D is a diagram illustrating a diced wafer 255 supported by a wafer support substrate (WSS) according to one embodiment of the invention. The WSS-supported diced wafer 255 includes a WSS 245 and a number of singulated thinned dice $260_1$ to $260_N$.

First, the WSS 245 is mounted onto a wafer. The mounting may be performed using an adhesive to attach the WSS 245 to the wafer. The wafer is then thinned to a desired thickness. For ultra-thin wafer, the thickness may be less than 75 µm, or may be approximately 50 µm. Then, a backside metallurgy (BSM) layer 250 is deposited on the backside of the wafer. This BSM layer 250 may have a thickness of about 3 to 10 µm. It serves to provide the basis for attachment during bonding. It may consist of a stack of metal layers such as titanium (Ti), nickel (Ni) and gold (Au). Besides these metal layers, it may also include a solder layer such as tin-copper. The solder layer serve as the thermal interface material (TIM) and it may have a process temperature range from 180° C. to 280° C. The solder material is carefully designed such that, after bonding, the TIM layer has a high remelting temperature (e.g., higher than 250° C.) and thus it does not melt again during die to substrate assembly processes. Then, the thinned wafer and the BSM layer 250 are diced, sawed, or singulated into individual dice.

Figure 2E:
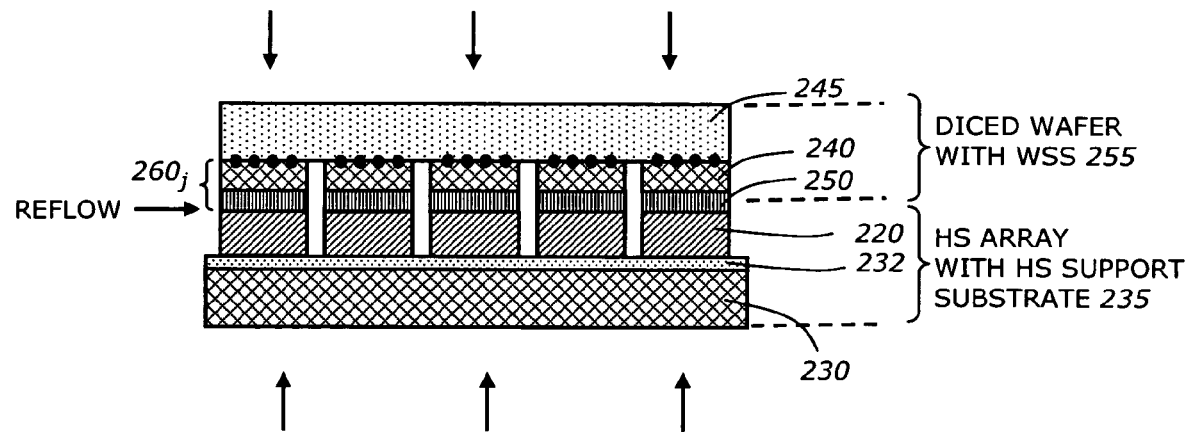
FIG. 2E is a diagram illustrating bonding the thin dice in the diced wafer to the heat spreaders in the HS array according to one embodiment of the invention.

FIG. 2E is a diagram illustrating bonding the thin dice in the diced wafer 255 to the heat spreaders in the HS array 235 according to one embodiment of the invention.

The HS array 235 is then positioned so that the HS 220 face toward to backside of the thinned wafer, or the thin dice $260_j$'s (j=1, ..., N). The thin dice $260_j$'s in the diced wafer 255 are then aligned to the HS 220 in the HS array with HS support substrate 235. Since the HS 220 are positioned according to the positions of the cavities, they are matched with the thin dice $260_j$'s.

The thin dice $260_j$'s in the diced wafer 255 are then bonded or attached to the HS 220 in the HS array with HS support substrate 235. The bonding may be performed by reflowing the solder layer on the HS array and/or the solder of the BSM layer 250 on the wafer under pressure from at least one of the WSS 245 or the HS support substrate 230. The pressure may be applied to both the WSS 245 and the HS support substrate 230, or one of them. The reflow causes the HS 220 to be bonded or attached to the corresponding thin dice $260_j$'s.

Figure 2F:
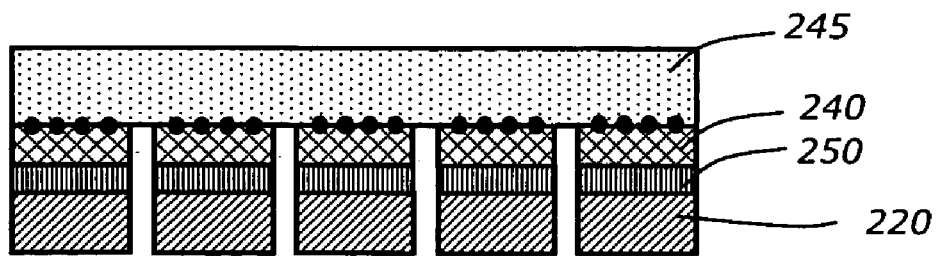
FIG. 2F is a diagram illustrating an HS-bonded diced wafer supported by a WSS according to one embodiment of the invention.

FIG. 2F is a diagram illustrating an HS-bonded diced wafer supported by a WSS according to one embodiment of the invention.

The adhesion strength between the HS 220 to the thin dice $260_j$'s is typically greater than the van der Waals force that keeps the HS 220 to the layer of silicone 232 on the HS support substrate 230. Therefore, the HS support substrate 230 and the coated layer of silicone 232 may be easily removed from the bonded assembly. The removal may be performed by vacuum sucking. There are other ways to release the HS 220 from the support substrate 230. Chemical solvent/laser/heat may also be utilized to facilitate the debonding.

Figure 2G:
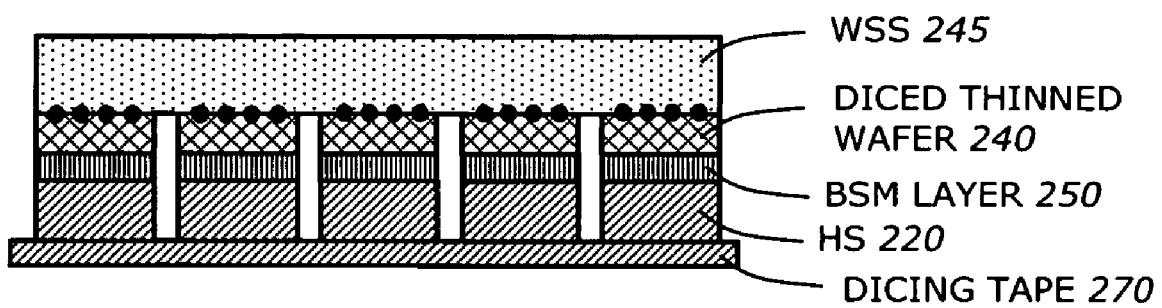
FIG. 2G is a diagram illustrating applying a dicing tape to the HS-bonded diced wafer supported by a WSS according to one embodiment of the invention.

FIG. 2G is a diagram illustrating applying a dicing tape to the HS-bonded diced wafer supported by a WSS according to one embodiment of the invention.

A dicing tape 270 is then attached or mounted onto the HS 220 of the thin dice assembly. The dicing tape 270 essentially holds the individual die assemblies together.

Figure 2H:
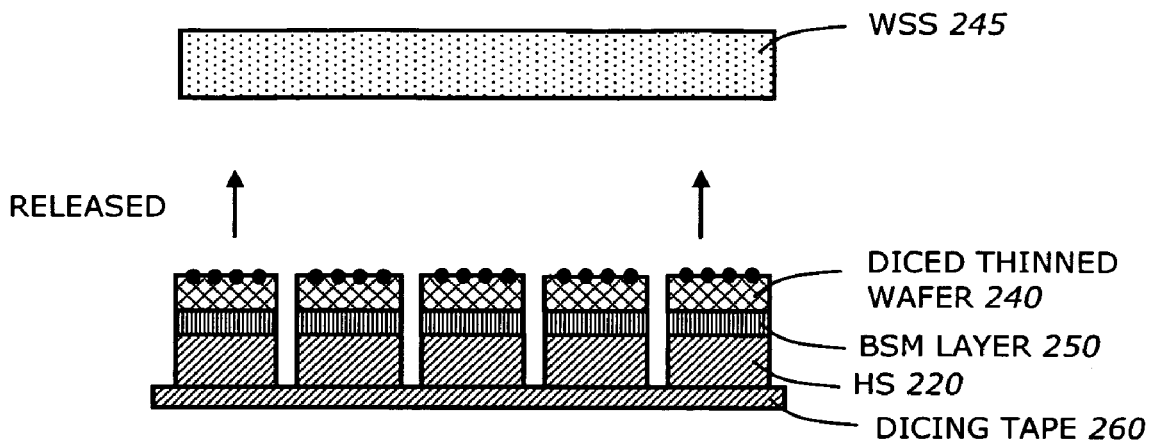
FIG. 2H is a diagram illustrating releasing the WSS from the HS-bonded diced wafer according to one embodiment of the invention.

FIG. 2H is a diagram illustrating releasing the WSS from the HS-bonded diced wafer according to one embodiment of the invention.

Figure 2I:
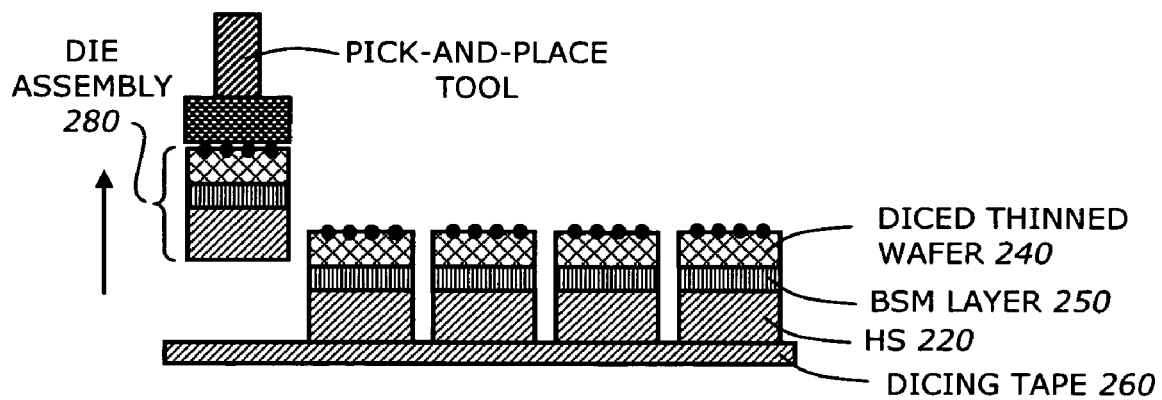
FIG. 2I is a diagram illustrating picking an individual die assembly according to one embodiment of the invention.

The WSS 245 is then released from the thin die assembly with the dicing tape 270. The release of the WSS 245 may be carried out by a number of methods including mechanical and thermal removal, laser or ultraviolet (UV) light. The laser may be used to irradiate the WSS 245. The irradiation may weaken the adhesion of adhesive that is used to attach the WSS 245 to the wafer 240. FIG. 2I is a diagram illustrating picking an individual die assembly according to one embodiment of the invention.

After the WSS 245 is removed, a pick-and-place equipment or tool may be used to pick up the individual die assemblies and assemble them into packages. A die assembly 280 now has a die, a first TIM, and a matching heat spreader.

Figure 3:
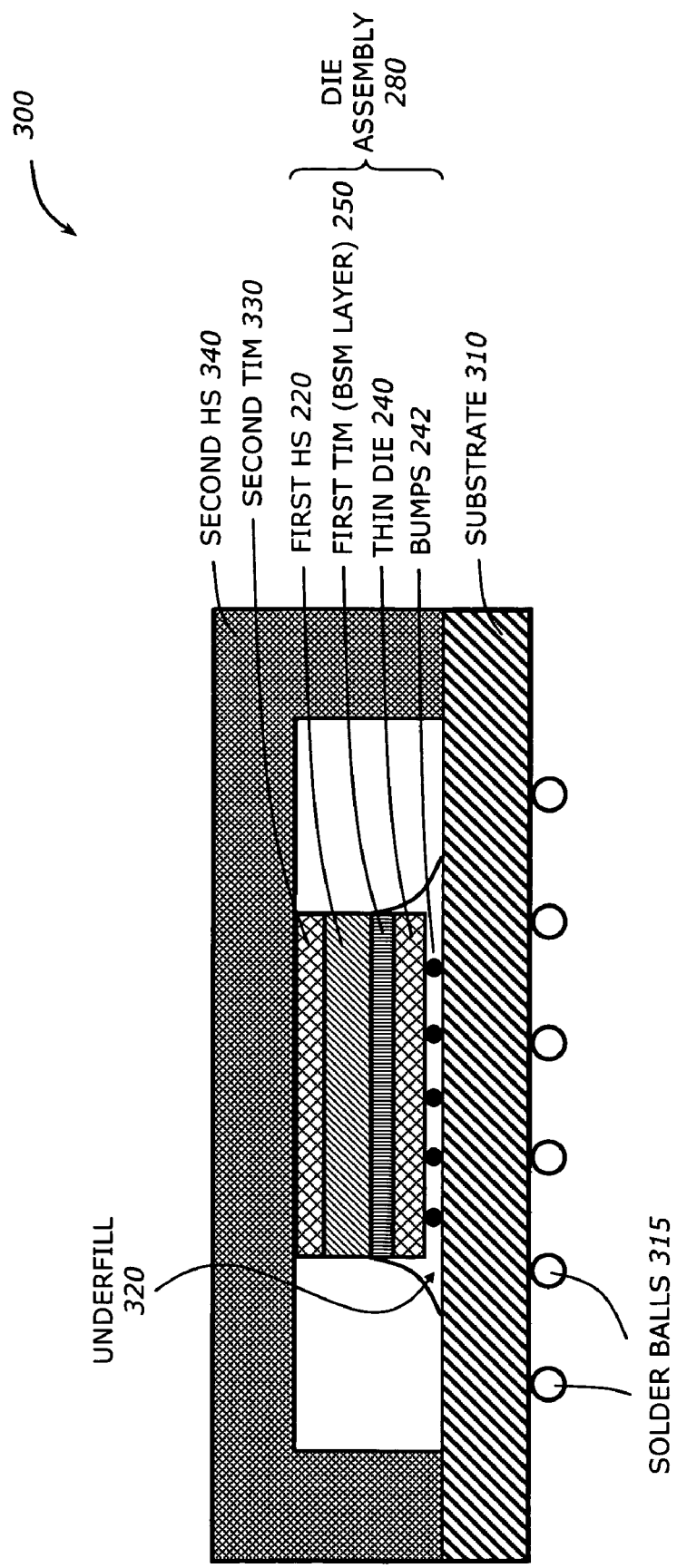
FIG. 3 is a diagram illustrating a package according to one embodiment of the invention.

FIG. 3 is a diagram illustrating a package 300 according to one embodiment of the invention. The package 300 includes a substrate 310, a die assembly 280, an underfill 320, a second TIM 330, and an integral heat spreader (IHS) 340. The die assembly 280 includes the thin die 240, a first TIM 250, and the HS 220. The package 300 may be a package 65 for the memory 178 or the DSP 176 shown in FIGS. 1A and 1B.

The substrate 310 is a package substrate that provides support for the thin die 240. The substrate 310 may be made of an organic or inorganic materials. The substrate 310 may be selected for any suitable packaging technologies including Ball Grid Array (BGA), Pin Grid Array (PGA), or Land Grid Array (LGA). A number of solder balls 315 may be attached to the substrate 310. The solder balls 315 allow attachment of the package device 65/178 to a circuit board or to any other mounting component. The die 240 is any semiconductor die. It may have a microelectronic device such as a microprocessor, a memory, an interface chip, an integrated circuit, etc. The die 240 is attached to the substrate 310 by a number of solder bumps 242. The bumps 242 provide contact with the contact pads on the substrate. The bumps 242 may be fabricated using any standard manufacturing or fabrication techniques such as the controlled collapse chip connect (C4) technique.

The underfill 320 is dispensed between die 240 and the substrate 310 to strengthen the attachment of die 240 to the substrate 310 to help prevent the thermal stresses from breaking the connections between die 240 and the substrate 310. The stresses may be caused by the difference between the coefficients of thermal expansion of die 240 and the substrate 310. The underfill 320 may contain filler particles suspended in an organic resin. The size of the filler particles are typically selected according to a gap between the die 240 and the substrate 310, e.g., the filler particles have a diameter about one third the size of the gap. Generally, the composition and concentration of filler particles are selected to control the coefficient of thermal expansion of the underfill 320.

The IHS or second HS 340 may house or cover the die assembly 280 on the substrate 310. It may include a flat surface and supporting walls on both or four sides of the die assembly 280. During operation, the die 240 may generate heat. The heat may be transferred to the IHS 340 through the first TIM 250 and a second TIM 330. The second TIM 330 may have a thickness of approximately 10 to 50 μm. The TIM 330 may be located, or interposed, between the bottom surface of the IHS 250 and the top surface of the HS 220 to encapsulate the cover assembly 260. It may be attached to a heat generating device, such as the die 240, to transfer the heat to a heat spreader or a heat sink or any another heat dissipating device. The TIM 330 may be made of a solder, a thermally conductive adhesive, a thermal grease, phase change material, etc.

The package 300 thus has two heat spreaders: the first HS 240 and the second HS 340. The two heat spreaders may be of the same or different materials. The package 300 also has two TIMs: the first TIM 250 and the second TIM 330. The package 300 therefore has a good heat transfer because the first HS 240 which has a much higher thermal conductivity than silicon is brought closer to the hot spots due to the thin silicon die and thin first TIM 250.

Figure 4:
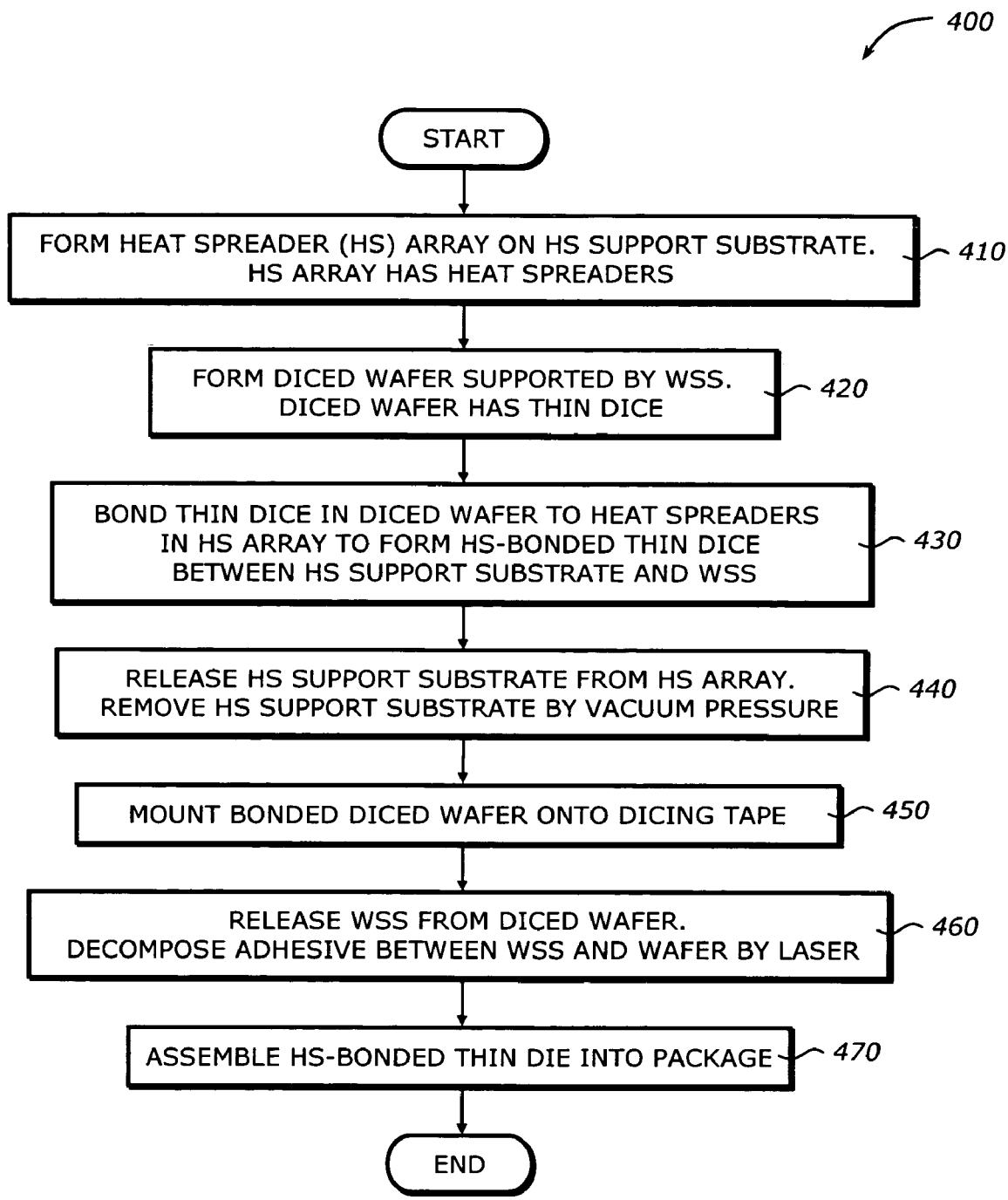
FIG. 4 is a flowchart illustrating a process to assemble wafer-level heat spreaders for dual HS packages according to one embodiment of the invention.

FIG. 4 is a flowchart illustrating a process 400 to assemble wafer-level heat spreaders for dual HS packages according to one embodiment of the invention.

Upon START, the process 400 forms a heat spreader (HS) array on a HS support substrate (Block 410). The HS array has a plurality of heat spreaders that have dimensions matched to the individual dice on the wafer. Next, the process 400 forms a diced wafer supported by a wafer support substrate (WSS) (Block 420). The diced wafer has a plurality of thin dice. Then, the process 400 bonds the thin dice in the diced wafer to the heat spreaders in the HS array to form HS-bonded thin dice between the HS support substrate and the WSS (Block 430).

Next, the process 400 releases the HS support substrate from the HS array (Block 440). Then, the process 400 mounts the bonded diced wafer onto a dicing tape (Block 450). Next, the process 400 releases the WSS from the diced wafer (Block 460). This may be performed by decomposing adhesive between the WSS and the wafer by laser. Then, the process 400 assembles an HS-bonded thin die into a package (Block 470). The process 400 is then terminated.

Figure 5:
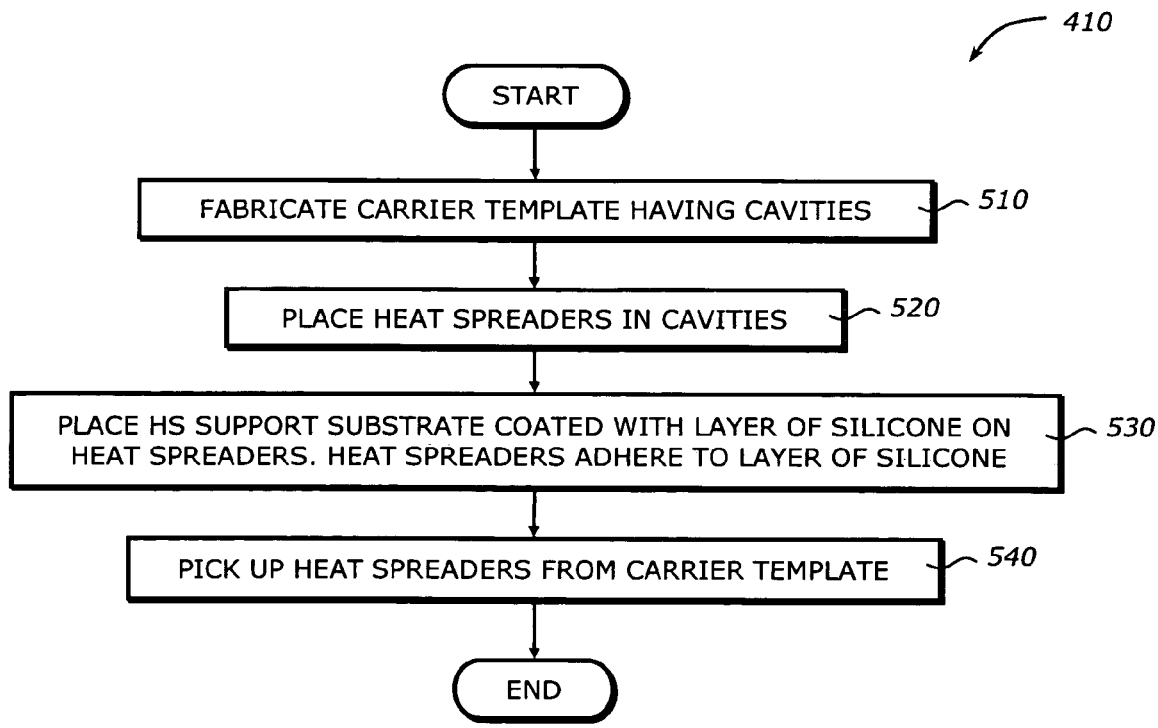
FIG. 5 is a flowchart illustrating a process to form a HS array on HS support substrate according to one embodiment of the invention.

FIG. 5 is a flowchart illustrating the process 410 shown in FIG. 4 to form a HS array on HS support substrate according to one embodiment of the invention.

Upon START, the process 410 fabricates a carrier template having a plurality of cavities (Block 510). The dimensions and positions of the cavities are matched to the dimensions and positions of the thin dice on the wafer. Next, the process 410 places the plurality of heat spreaders in the cavities (Block 520). This may be performed using self-assembly such as using the shaker shown in FIG. 2B. Then, the process 410 places, or presses, the HS support substrate coated with a layer of silicone such as PDMS on the plurality of heat spreaders (Block 530). Under the pressing force, the heat spreaders adhere to the layer of silicone through the van der Waals force. Next, the process 410 picks up the plurality of heat spreaders from the carrier template (Block 540). The process 410 is then terminated.

Figure 6:
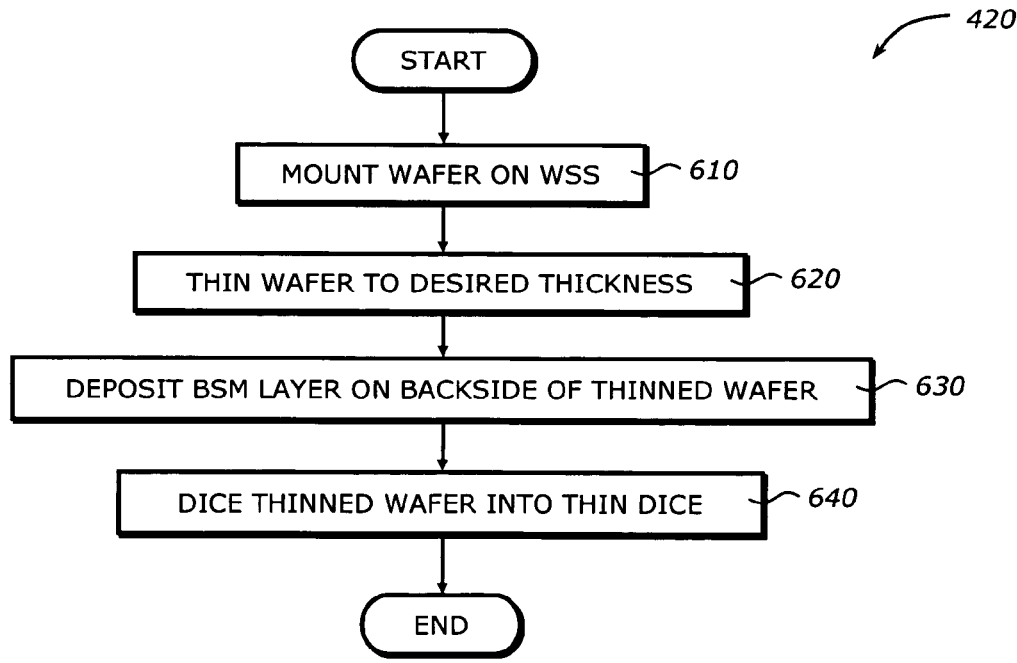
FIG. 6 is a flowchart illustrating a process to form diced wafer supported by a WSS according to one embodiment of the invention.

FIG. 6 is a flowchart illustrating the process 420 shown in FIG. 4 to form diced wafer supported by a WSS according to one embodiment of the invention.

Upon START, the process 420 mounts a wafer on a wafer support substrate (WSS) (Block 610). Next, the process 420 thins the wafer to a desired thickness (Block 620). Any thinning technique may be employed. For ultra-thin wafer, the desired thickness may be less than 50 µm. Then, the process 420 deposits a backside metallurgy (BSM) layer on backside of the thinned wafer (Block 630). The BSM layer may be made of any suitable material, such as a solder. Next, the process 420 dices, saws, or singulates the thinned wafer into the plurality of thin dice (Block 640). The process 420 is then terminated.

Figure 7:
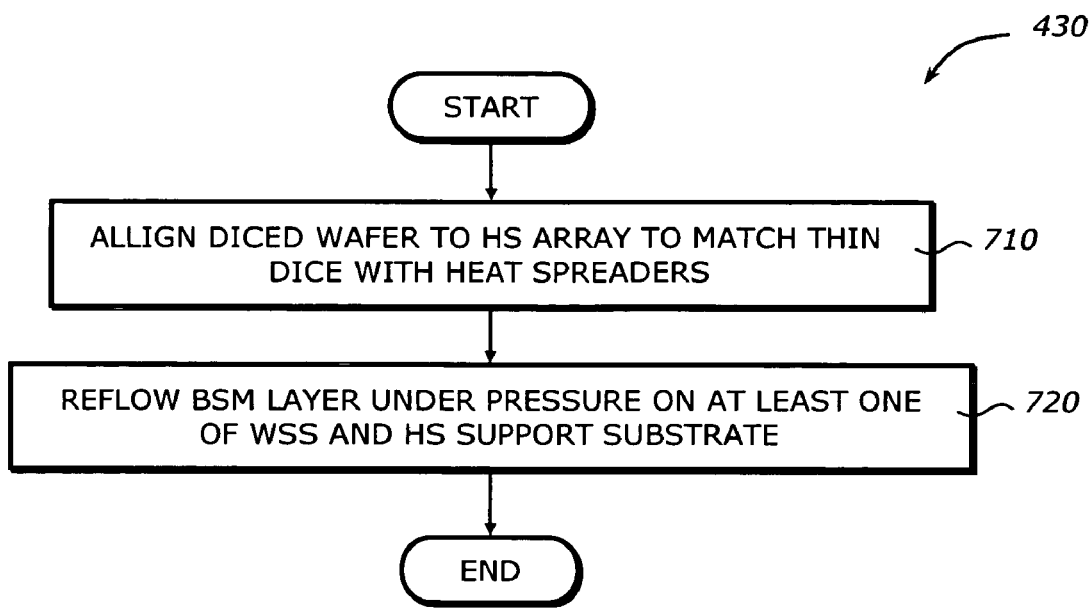
FIG. 7 is a flowchart illustrating a process to bond thin dice to heat spreaders according to one embodiment of the invention.

FIG. 7 is a flowchart illustrating the process 430 shown in FIG. 4 to bond thin dice to heat spreaders according to one embodiment of the invention.

Upon START, the process 430 aligns the diced wafer to the HS array to match the thin dice with the heat spreaders (Block 710). Next, the process 430 reflows the solder layer under pressure on at least one of the WSS and the HS support substrate (Block 720). The reflow causes bonding or attachment of the array of heat spreaders to the diced and thinned dice. The process 430 is then terminated.

Figure 8:
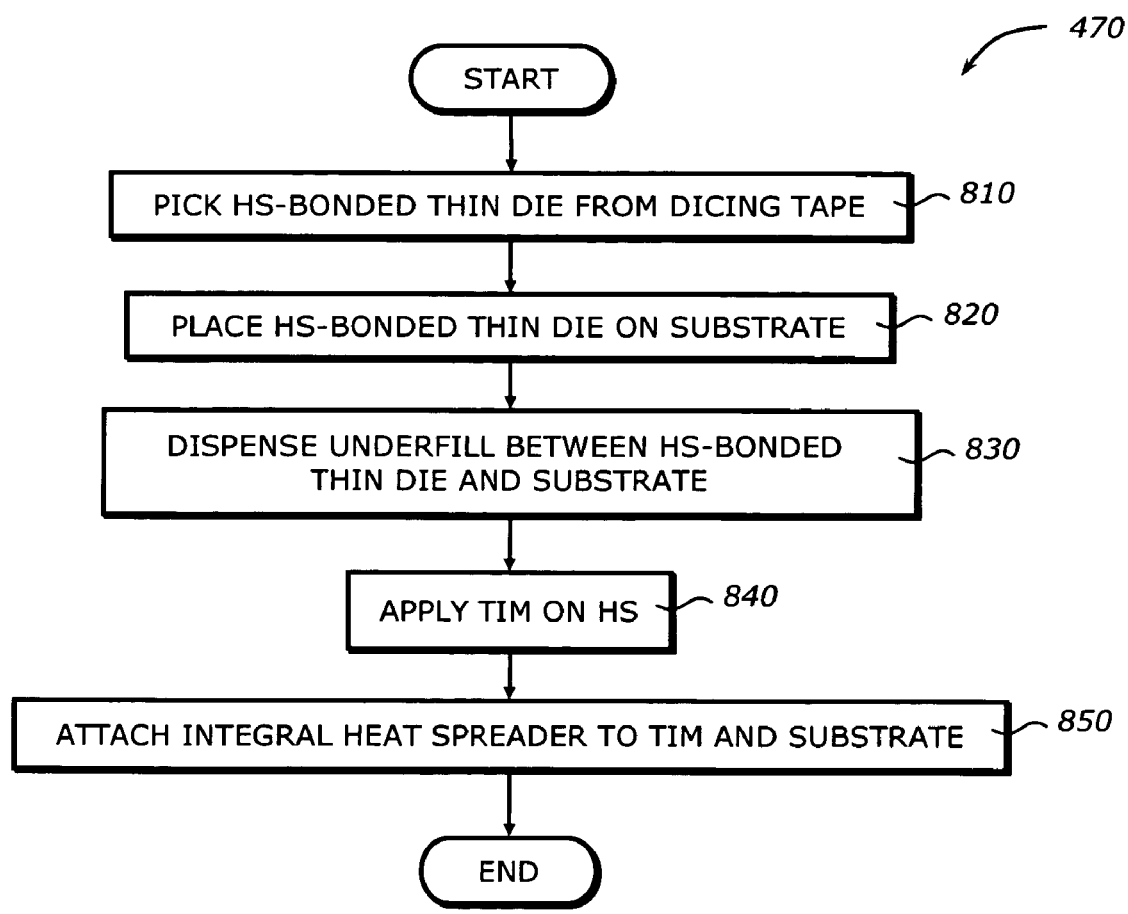
FIG. 8 is a flowchart illustrating a process to assemble a HS-bonded thin die into a package according to one embodiment of the invention.

FIG. 8 is a flowchart illustrating the process 470 shown in FIG. 4 to assemble a HS-bonded thin die into a package according to one embodiment of the invention.

Upon START, the process 470 picks the HS-bonded thin die from the dicing tape (Block 810). Next, the process 470 places, or attaches, the HS-bonded thin die on a substrate (Block 820). Then, the process 470 dispenses an underfill between the HS-bonded thin die and the substrate (Block 830) and then cure the underfill.

Next, the process 470 applies a thermal interface material (TIM) on the HS (Block 840). Then, the process 470 attaches an integral heat spreader to the TIM and the substrate (Block 850). The process 470 is then terminated.

An embodiment of the invention is described to provide superior thermal and mechanical performance. Throughout the process, the HS support substrate and the WSS provide mechanical support for the HS array or the thin dice. After they serve their function, they may be released from the assembly. The bonding of the thin dice to the HS array is performed at the wafer level. The resulting package essentially includes two integrated HSs. One is directly on top of the die and the other is the normal IHS attached to the first HS.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
    forming a heat spreader (HS) array on a HS support substrate, the HS array having a plurality of heat spreaders;
    forming a diced wafer supported by a wafer support substrate (WSS), the diced wafer having a plurality of thin dice; and
    bonding the plurality of thin dice in the diced wafer to the plurality of heat spreaders in the HS array to form HS-bonded thin dice between the HS support substrate and the WSS.

2. The method of claim 1 further comprising:
    releasing the HS support substrate from the HS array;
    mounting the bonded diced wafer onto a dicing tape;
    releasing the WSS from the diced wafer; and
    assembling an HS-bonded thin die into a package, the HS-bonded thin die having a die heat spreader (HS).

3. The method of claim 1 wherein forming the HS array comprises:
    fabricating a carrier template having a plurality of cavities;
    placing the plurality of heat spreaders in the plurality of cavities;
    placing the HS support substrate coated with a layer of silicone on the plurality of heat spreaders, the heat spreaders adhering to the layer of silicone; and
    picking up the plurality of heat spreaders from the carrier template.

4. The method of claim 1 wherein forming the diced wafer comprises:
    mounting a wafer on a wafer support substrate (WSS);
    thinning the wafer to a desired thickness to provide a thinned wafer;
    depositing a backside metallization (BSM) and a solder layer on backside of the thinned wafer; and
    dicing the thinned wafer into the plurality of thin dice.

5. The method of claim 4 wherein bonding the plurality of thin dice comprises:
    aligning the diced wafer to the HS array to match the plurality of thin dice with the plurality of heat spreaders; and
    reflowing the solder layer of the BSM under pressure on at least one of the WSS and the HS support substrate.

6. The method of claim 2 wherein releasing the HS support substrate comprises:
    removing the HS support substrate by vacuum pressure.

7. The method of claim 2 wherein releasing the WSS comprises:
    decomposing adhesive between the WSS and the diced wafer by laser.

8. The method of claim 2 wherein assembling the HS-bonded thin die comprises:
    picking the HS-bonded thin die from the dicing tape;
    placing the HS-bonded thin die on a substrate;
    dispensing an underfill between the HS-bonded thin die and the substrate;
    applying a thermal interface material (TIM) on the die HS; and
    attaching an integral heat spreader to the TIM and the substrate.

* * * * *